United States Patent
Baldi et al.

[11] Patent Number: 6,061,269
[45] Date of Patent: *May 9, 2000

[54] P-CHANNEL MEMORY CELL AND METHOD FOR FORMING THE SAME

[75] Inventors: Livio Baldi, Agrate Brianza; Paola Paruzzi, Robblate, both of Italy

[73] Assignee: STMicroeletronics S.r.l., Agrate Brianza, Italy

[ * ] Notice: This patent issued on a continued prosecution application filed under 37 CFR 1.53(d), and is subject to the twenty year patent term provisions of 35 U.S.C. 154(a)(2).

[21] Appl. No.: 08/613,443

[22] Filed: Mar. 4, 1996

[30] Foreign Application Priority Data

Mar. 3, 1995 [EP] European Pat. Off. ............. 95830071

[51] Int. Cl.$^7$ .................................................. G11C 16/04
[52] U.S. Cl. ...................................... 365/185.01; 257/316
[58] Field of Search ...................... 365/185.01; 257/316, 257/315

[56] References Cited

U.S. PATENT DOCUMENTS

| | | | |
|---|---|---|---|
| 3,660,819 | 5/1972 | Frohman-Bentchkowsky | .... 317/235 R |
| 4,267,558 | 5/1981 | Guterman | ................................... 357/41 |
| 5,326,999 | 7/1994 | Kim et al. | .......................... 365/185.01 |
| 5,817,536 | 10/1998 | Nayak | ....................................... 438/17 |

FOREIGN PATENT DOCUMENTS

| | | |
|---|---|---|
| 0 255 489 A2 | 2/1988 | European Pat. Off. . |
| 20 39 955 | 2/1971 | Germany . |
| 26 36 350 | 12/1977 | Germany . |

OTHER PUBLICATIONS

R. Warner et al., "Integrated Circuits–Design Prin +Fabr," ©1965 Motorola, Inc., McGraw Hill Book Co., pp. 69–94.

Tarui, Yasuo, et al., "Proposal of Electrically Reprogrammable, Nonvolatile Semiconductor Memory," *Proceedings of the 3$^{rd}$ Conference on Solid State Devices,* Tokyo, Japan, 1971, pp. 155–162.

*Primary Examiner*—A. Zarabian
*Attorney, Agent, or Firm*—Theodore E. Galanthay; Robert Iannucci; Seed IP Law Group PLLC

[57] ABSTRACT

The present invention concerns an electrically programmable and erasable non-volatile memory cell having a traditional structure but being inverted in the conductivity type of the component elements and lacking the second source diffusion.

10 Claims, 2 Drawing Sheets

6,061,269

P-CHANNEL MEMORY CELL AND METHOD FOR FORMING THE SAME

TECHNICAL FIELD

The present invention relates to a memory cell and to FLASH and EEPROM memory devices in which this cell finds advantageous application.

BACKGROUND OF THE INVENTION

A very serious problem in the area of semiconductor memories is power consumption.

The article of D. Cantarelli, A. Maurelli and L. Baldi, "A high-performance p-channel EPROM cell", ESSDERC 1987, Proceedings, pages 769–771, proposes a p-channel cell instead of an n-channel cell as in the well-established tradition for the manufacture of EPROM memory devices. This article underscores the various advantages of inversion of the type of conductivity of the elements making up the traditional structure of the EPROM memory cell, among which is that of low power consumption in the writing phase.

In recent years, electrically programmable and erasable non-volatile memories such as FLASH and EEPROM memories have spread widely, in particular for applications where low power consumption is a very important requisite.

Applying the lesson of the above mentioned article to these types of memories, what is obtained is a new type of electrically programmable and erasable non-volatile memory cell whose cross section is shown in the annexed FIG. 1. But the gate oxide in this case is thinner to allow conduction by tunnel effect and can be 8 nm to 9 nm for EEPROM memories and 10 nm to 12 nm for FLASH memories.

The memory cell of FIG. 1 consists of a double-gate MOS transistor and comprises a type-n zone 1, two p-type regions 2 and 3 implemented in the zone 1 and separated from each other by a spacing, and a double gate structure implemented over the zone 1 opposite the spacing. The double-gate structure comprises an insulated gate 5 and a connected gate 4 superimposed on and insulated from the gate 5 and inserted in a layer 6 of insulating material. The region 2 extends beneath the insulated gate 5. The space 9 of the region 2 bordering on the zone 1 is normally doped more lightly than the remaining space. FIG. 1 also shows two layers 7 and 8 of insulating material which leave two openings over the regions 2 and 3 respectively for optional contacts. This structure corresponds to one of traditional type such as, e.g., that illustrated in FIG. 7 of U.S. Pat. No. 4,142,926, except for the type of conductivity of the constituting elements.

As known, the space 9 is very important in the erasing phase of the cell to permit passage of charges from the insulated gate 5 to the region 2, which corresponds to the source region of the MOS transistor.

From U.S. Pat. No. 4,203,158 is known a more sophisticated solution to this problem, and which, however, implies again superimposing (more generally an approach) between the insulated gate and the source region.

Implementation of this superimposition involves considerable complication in the production process in terms both of number of masks required and production time. Furthermore, at high integration levels, e.g. 0.5–1.0 u technologies, the space 9 (which can be an extension of e.g. 0.15–0.3 u beneath the insulated gate) considerably affects the minimal size of the cell.

A process of this type and which also allows simultaneous manufacture of FLASH and EEPROM memory cells is illustrated in U.S. Pat. No. 4,957,877. A discussion of these problems and their possible solutions both as to structure and as to process is found in U.S. Pat. No. 5,102,815.

SUMMARY OF THE INVENTION

In accordance with one aspect of the present invention, a memory cell includes a first p-type region that is formed in an n-type substrate and has a first impurity concentration. A second p-type region is formed in the substrate and has a second impurity concentration. A first channel region is disposed in the substrate between and contiguous with the first and second p-type regions. A tunnel insulator is formed on the channel region. A floating gate is formed on the tunnel insulator and is substantially symmetrically aligned with the first and second p-type regions. An intermediate insulator is formed on the floating gate, and a control gate is formed on the intermediate insulator.

An advantage of the present invention is that the second source diffusion in the tunneling region, which typically extends a significant distance beneath the floating gate, is not necessary in one embodiment.

Another advantage of the invention is that it uses a traditional cell structure and inverts the type of conductivity of the constituting elements to allow the omittance of the second source diffusion.

Furthermore, in addition to possessing the known advantages of p-channel EPROM cells such as low consumption and which are still more important in view of the typical applications of FLASH and EEPROM memories, the memory cells according to the invention are easier to integrate with the MOS transistors of the traditional logic circuits because their structure is more similar thereto.

Furthermore, many of the known provisions of the manufacturing techniques for MOS transistors to reduce the intensity of the electrical field in the channel region, and consequently the harmful effect of the "hotly" electrons, are advantageously applicable to the memory cells according to the invention, e.g., the lightly doped drain (LDD) technique. Advantageously for manufacturing, the use of these provisions maintains the similarity of the cells and the transistors. In the case of the cells, a low intensity of the electrical field permits reduction of writing parasites from the drain region.

BRIEF DESCRIPTION OF THE DRAWINGS

The invention is clarified by the description given below considered together with the annexed drawings wherein.

DETAILED DESCRIPTION OF THE INVENTION

Figure 1:
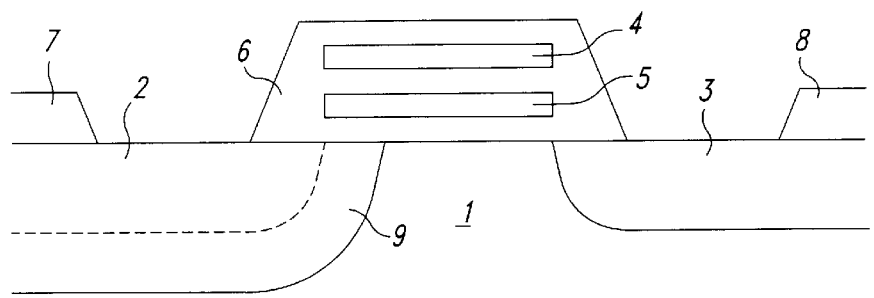
FIG. 1 shows a cross section of a structure of a flash memory cell in accordance with the prior art.
Figure 2:
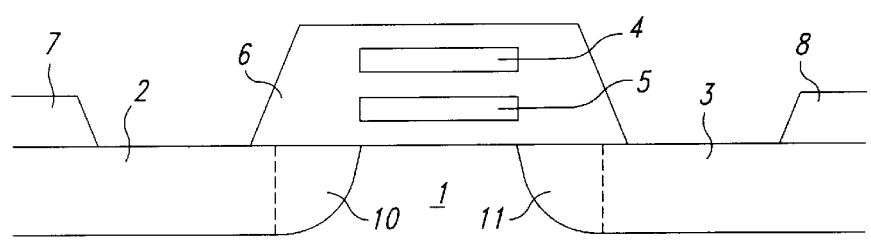
FIGS. 2, 3 and 4 show cross sections of three FLASH memory cell structures in accordance with the present invention.

The cell of FIG. 2 is equivalent to that of FIG. 1 described above, but the regions 2 and 3 are generally symmetrical, i.e., the diffusion or section 9 is not made. Even without the diffusion 9, the channel formed during the erasing of the memory cell according to the present invention allows the passage of a sufficient number of charges between the insulated gate 5 and the region 2 for the erasing to occur.

In a first embodiment, the regions 2 and 3 exhibit internally a generally uniform doping.

In order to reduce the intensity of the electrical field in the channel region, the regions 2 and 3 can have different doping profiles. A first possibility consists of providing that the spaces 10 and 11, bordering on the channel region which separates the regions 2 and 3, be doped more lightly. A second possibility is shown in FIG. 3 and consists of providing that all the spaces 12 and 13 bordering on the zone 1 be doped more lightly.

Figure 3:
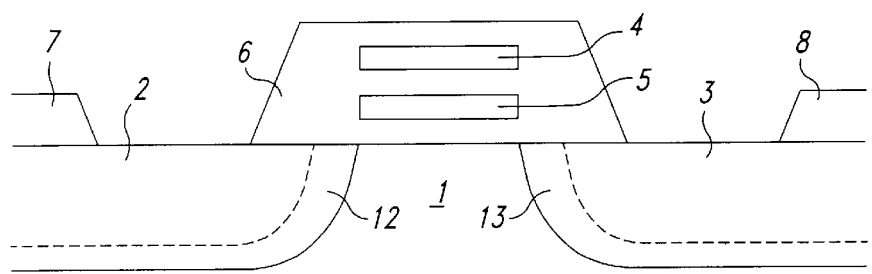

The regions 2 and 3 can also have different doping profiles, e.g., the region 2 can be the type shown in FIG. 2 and the region 3 can be the type shown in FIG. 3. Furthermore, since it is more important for parasitic writings that the cell have a more lightly doped section in the region 3, i.e., the drain region, such a section can be avoided in the region 2.

In the embodiments shown in FIG. 2 and FIG. 3, the regions 2 and 3 do not extend beneath the insulated gate 5, since this would have no advantage. However, the extension of the regions 2 and 3 must be such that the channel formed under the insulated gate 5 connects these two regions.

Figure 4:
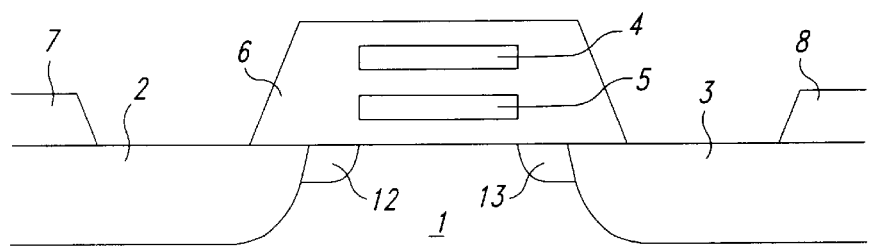

Another possible embodiment is shown in FIG. 4. In this case, beside the regions 2 and 3 on the channel region sides, there are placed two other regions 14 and 15 respectively, again with type p conductivity but doped more lightly than the regions 2 and 3. This structure is the equivalent for memory cells of the LDD structure for logic transistors. Even in this case, the regions 14 and 15 do not extend beneath the insulated gate 5, but the extension of the regions 14 and 15 must be such that the channel formed below the insulated gate 5 connects these two regions.

As mentioned above, it is more important for parasitic writings for the cell to have a more lightly doped section at the region 3, and it is thus possible to avoid making the region 14 and extend the remainder of the region 2 to the edge of the floating gate 5.

In another alternative embodiment of the memory cell, either one or both of the regions 2 and 3 extends laterally, to be beneath the floating gate 5. For example, referring to FIG. 2, in the alternative embodiment either one or both of the regions 10 and 11 extends beneath the floating gate 5. Referring to FIG. 3, in the alternative embodiment either one or both of the regions 12 and 13 extends beneath the floating gate 5. Referring to FIG. 4, in the alternative embodiment either one or both of the regions 14 and 15 extends beneath the floating gate 5.

It would seem that the implementation of this structure is technically more complex than that of the structures of FIG. 2 and FIG. 3, but if this structure is to be integrated in a chip with logic transistors with LDD structures as often happens, not only is there no additional complexity, but instead there is a reduction of the number of process steps, since separate steps are not necessary for implementation of the cells and transistors.

The p-channel transistors are characterized by the presence of a completely different mechanism for injection of electrons into the insulated gate, and do not require avalanche multiplication in the drain region, and hence high electrical fields. The mechanism is linked to the fact that under strong saturation conditions, the electrical field is very favorable to the injection of electrons into the gate, is several orders of magnitude more efficient than that operating in the n-channel transistors, and produces huge gate currents even at low drain currents. In particular, optimal injection conditions are had with the drain region at relatively high potential (less than −6V) and with the gate just over the threshold. It is then possible to obtain the same charge injected into the insulated gate with a much lower total drain charge and this involves smaller charge pump voltage circuits and facilitates the implementation of integrated devices powered at low voltages. Furthermore, given the characteristics of the p-channel transistors, at no time during writing is there firing of an avalanche multiplication, and, therefore, the substrate currents generated are negligible. Such negligible substrate currents provide considerable advantages for reliability and design flexibility, because it is not necessary to ensure frequent substrate contacts and it is possible to operate the cell even in a process having n-type conductivity.

Implantation of the source and drain regions is not necessarily required to be self-aligning with the gate, since it is not necessary to accentuate the avalanche multiplication. For example, in one embodiment of the invention, the control gate 4 and the floating gate 5 are doped to have an n-type conductivity, and the source and drain regions, are of a p-type conductivity. In an alternative embodiment, the gates 4 and 5 are doped p-type and the source and drain are self-aligned to the gates by doping all in a single process step.

As it is not necessary to implement excessively high gate voltages, the capacitive coupling between insulated gate and connected gate can be less than that of the n-channel cells, and hence the extension of the so-called "tabs" in the "field" can be reduced.

The "virgin" cell in accordance with the present invention has an intrinsically high threshold between approximately −1.2V and −1.4V with no need of additional implantation and especially if n-doped floating and control gates are used as in the standard CMOS technology.

Writing is achieved by applying a high enough negative voltage on the drain (from −6V to −8V depending on the thickness of the tunnel oxide) and a voltage above the threshold of the connected gate. As the effectiveness of injection decreases rapidly for gate voltages much higher than the threshold, the choice of the voltage applied to the connected gate is dictated only by reasons of consumption and noise.

Erasing is achieved by applying to the connected gate a negative voltage between approximately −9V and −11V depending on the thickness of the tunnel oxide, and keeping the source terminal grounded. This voltage sends the channel into conduction. Hence, the tunnel effect takes place towards all of the channel region and without voltage differences between the latter and the substrate. Thus, such a tunnel effect avoids the band-to-band tunneling phenomenon between the source region and the substrate typical of n-channel memory cells, such band-to-band tunneling being responsible for nearly all the erasing current. Thus, good reliability is ensured. Erasing takes the threshold voltage towards high positive values that begin to close the channel, and is thus self-limiting. Thus, the over-erasing problems typical of n-channel memory cells are avoided.

Figure 5:
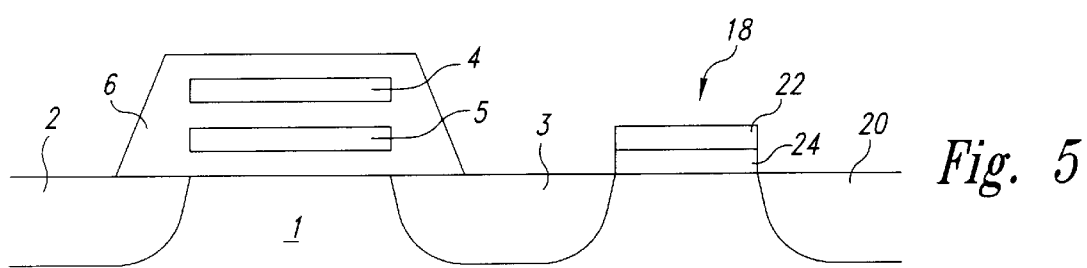
FIG. 5 shows a cross-section of a memory cell in accordance with the present invention and an associated access transistor.

Referring to FIG. 5, an EEPROM cell with an access transistor can be easily derived from the cell described by means of mere addition of a conventional p-channel single-gate MOS transistor 18 implemented in the substrate beside one of the regions 2 and 3. The transistor 18 includes p-doped region 20, and shares p-doped region 3 with the EEPROM cell. The transistor 18 also includes a gate 22 and a gate insulator 24. Normally the transistor 18 is arranged beside the drain region of the memory cell.

As mentioned above, the cells described can be used arranged in a matrix, in FLASH EPROM and/or EEPROM memory devices.

The present invention finds particular application in memory integrated devices powered with low voltage, e.g., 3V, for the above mentioned advantages of low consumption and ease of programming and erasing at low voltage. It is also noted that in addition to being an advantage in itself, low consumption has a beneficial effect on the dimensions of voltage-raising circuits which are necessary for achieving writing and erasing voltages well above e.g. 3V and especially when it is necessary to raise voltage by a high factor, e.g., 3 to 4.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. An electrically erasable and programmable memory cell, comprising:
   a p-type drain region disposed in an n-type region of a substrate and having a first impurity concentration;
   a distinct p-type lightly doped drain region disposed in said n-type region, contiguous with said drain region, and having a second impurity concentration that is significantly less than said first impurity concentration;
   a p-type source region disposed in said n-type region and having a third impurity concentration;
   a first channel region disposed in said n-type region between and contiguous with said lightly doped drain and said source regions;
   a tunnel insulator disposed on said first channel region;
   a floating gate disposed on said tunnel insulator and spaced laterally from said drain region;
   an intermediate insulator disposed on said floating gate; and
   a control gate disposed on said intermediate insulator, wherein said source and lightly doped drain regions do not extend beneath said floating gate.

2. The memory cell of claim 1, further comprising:
   a distinct p-type lightly doped source region disposed in said n-type region between and contiguous with said source and said first channel regions, said lightly doped source region having a fourth impurity concentration that is significantly less than said third impurity concentration.

3. The memory cell of claim 1, further comprising:
   a p-type source/drain region disposed in said n-type region and spaced apart from said drain and source regions;
   a second channel region disposed in said n-type region between and contiguous with said drain and source/drain regions;
   a gate insulator disposed on said second channel region; and
   an access gate disposed on said gate insulator.

4. The memory cell of claim 1 wherein said first and and third impurity concentrations are approximately equal.

5. Memory cell of a double-gate MOS transistor programmable and erasable electrically type comprising:
   a zone of a first type of conductivity;
   source and drain regions of a second type of conductivity implemented in said zone, said source and drain regions having a first and second doping concentrations, respectively;
   a lightly doped drain region of said second type of conductivity implemented in said zone and distinct from and contiguous with said drain region, said source region and said lightly doped drain region separated from each other by a spacing, said lightly doped drain region having a third doping concentration that is significantly less than said second doping concentration;
   a structure with a double gate implemented over said zone opposite said spacing, said structure spaced laterally from said drain region, wherein said structure comprises at least one isolated gate and wherein said source and lightly doped drain regions do not extend beneath said isolated gate; and
   wherein said first type of conductivity is n-type and said second type of conductivity is p-type.

6. Cell in accordance with claim 5, further comprising:
   a lightly doped source region of said second type of conductivity that is distinct from said source region and that is implemented in said zone between and contiguous with said source region and said spacing, said lightly doped source region having a fourth doping concentration that is significantly less than said first doping concentration.

7. Cell in accordance with claim 5 wherein said lightly doped drain region extends along an entire portion of said drain region that faces said zone.

8. Cell in accordance with claim 5, further comprising another transistor of the p-channel single-gate MOS type that is implemented in said zone beside one of said source and drain regions.

9. EEPROM memory device comprising a cell matrix in accordance with claim 8.

10. Flash memory device comprising a cell matrix in accordance with claim 5.

* * * * *